US 11,393,871 B2

(12) United States Patent
Guo et al.

(10) Patent No.: US 11,393,871 B2
(45) Date of Patent: Jul. 19, 2022

(54) ARRAY SUBSTRATE AND DISPLAY PANEL HAVING FORCE TFT

(71) Applicant: BOE TECHNOLOGY GROUP CO., LTD, Beijing (CN)

(72) Inventors: Yuzhen Guo, Beijing (CN); Xue Dong, Beijing (CN); Haisheng Wang, Beijing (CN); Chunwei Wu, Beijing (CN); Yingming Liu, Beijing (CN); Xiaoliang Ding, Beijing (CN); Xueyou Cao, Beijing (CN); Chihjen Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 77 days.

(21) Appl. No.: 16/093,355

(22) PCT Filed: Jan. 30, 2018

(86) PCT No.: PCT/CN2018/074556
§ 371 (c)(1),
(2) Date: Oct. 12, 2018

(87) PCT Pub. No.: WO2018/233295
PCT Pub. Date: Dec. 27, 2018

(65) Prior Publication Data
US 2021/0217810 A1     Jul. 15, 2021

(30) Foreign Application Priority Data
Jun. 19, 2017 (CN) .......................... 201710466119.1

(51) Int. Cl.
*H01L 27/20*       (2006.01)
*H01L 27/28*       (2006.01)
(Continued)

(52) U.S. Cl.
CPC .............. *H01L 27/20* (2013.01); *H01L 25/18* (2013.01); *H01L 25/50* (2013.01);
(Continued)

(58) Field of Classification Search
CPC ... H01L 27/20; H01L 27/283; H01L 27/3274; H01L 27/3248; H01L 27/3204;
(Continued)

(56) References Cited

U.S. PATENT DOCUMENTS 9,397,124 B2 *   7/2016   Choi ................... H01L 27/1251
10,468,434 B2 *   11/2019   Lee ..................... H01L 27/1251
(Continued)

FOREIGN PATENT DOCUMENTS

CN     101800288 A     8/2010
CN     103887324 A     6/2014
(Continued)

OTHER PUBLICATIONS

First Office Action dated May 7, 2019 corresponding to Chinese application No. 201710466119.1.
(Continued)

*Primary Examiner* — Ida M Soward
(74) *Attorney, Agent, or Firm* — Nath, Goldberg & Meyer; Joshua B. Goldberg (57) ABSTRACT

A method for fabricating an array substrate, a display panel, and a display device is provided. The array substrate is divided into a plurality of pixel regions, and each of the pixel regions is provided with a pixel thin film transistor (TFT). At least one of the pixel regions is provided with a pressure component and a force TFT, the force TFT includes a first electrode, a second electrode and a control electrode, and the pressure component is connected to one of the first electrode and the control electrode of the force TFT. At least one of
(Continued)

layer structures of the pixel TFT is disposed in the same layer as a corresponding layer structure of the force TFT.

18 Claims, 6 Drawing Sheets

(51) Int. Cl.
| | | |
|---|---|---|
| *H01L 27/12* | (2006.01) | |
| *H01L 27/14* | (2006.01) | |
| *H01L 27/15* | (2006.01) | |
| *H01L 25/18* | (2006.01) | |
| *H01L 33/08* | (2010.01) | |
| *H01L 29/78* | (2006.01) | |
| *H01L 41/113* | (2006.01) | |
| *H01L 51/52* | (2006.01) | |
| *H01L 25/00* | (2006.01) | |
| H01L 27/32 | (2006.01) | |
| H01L 29/786 | (2006.01) | |
| H01L 27/146 | (2006.01) | |

(52) U.S. Cl.
CPC .... *H01L 27/1251* (2013.01); *H01L 27/14678* (2013.01); *H01L 27/153* (2013.01); *H01L 27/156* (2013.01); *H01L 27/283* (2013.01); *H01L 27/323* (2013.01); *H01L 27/3204* (2013.01); *H01L 27/3244* (2013.01); *H01L 27/3248* (2013.01); *H01L 27/3274* (2013.01); *H01L 29/78633* (2013.01); *H01L 29/78648* (2013.01); *H01L 33/08* (2013.01); *H01L 51/5253* (2013.01); *H01L 51/5296* (2013.01); *H01L 2251/556* (2013.01)

(58) Field of Classification Search
CPC ... H01L 27/153; H01L 27/1251; H01L 25/18; H01L 33/08; H01L 51/5296; H01L 29/78633; H01L 29/78648; H01L 27/3272; H01L 27/1214; H01L 27/3262; H01L 27/3251; H01L 27/3211; H01L 27/323; H01L 27/14678; H01L 51/5253; H01L 2251/556; H01L 41/1132
See application file for complete search history.

(56) References Cited

U.S. PATENT DOCUMENTS

| | | | | |
|---|---|---|---|---|
| 10,763,282 | B2* | 9/2020 | Koezuka | H01L 27/1237 |
| 10,847,545 | B2* | 11/2020 | Lee | H01L 27/124 |
| 2007/0161159 | A1* | 7/2007 | Yamazaki | H01L 27/13 |
| | | | | 438/149 |
| 2011/0024751 | A1* | 2/2011 | Yamazaki | H01L 27/1225 |
| | | | | 257/57 |
| 2011/0037068 | A1* | 2/2011 | Yamazaki | H01L 27/3262 |
| | | | | 257/43 |
| 2016/0064685 | A1* | 3/2016 | Kim | B32B 37/003 |
| | | | | 428/137 |
| 2017/0012137 | A1 | 1/2017 | Hirakata et al. | |
| 2018/0181247 | A1* | 6/2018 | Yang | G06F 3/0416 |
| 2018/0204896 | A1* | 7/2018 | Park | H01L 27/3258 |
| 2018/0348917 | A1* | 12/2018 | Wang | G06F 3/046 |

FOREIGN PATENT DOCUMENTS

| | | |
|---|---|---|
| CN | 104020892 A | 9/2014 |
| CN | 105514119 A | 4/2016 |
| CN | 105867688 A | 8/2016 |
| CN | 105974637 A | 9/2016 |
| CN | 205788139 U | 12/2016 |
| CN | 106384739 A | 2/2017 |
| CN | 107293553 A | 10/2017 |

OTHER PUBLICATIONS

International Search Report dated May 7, 2018 corresponding to application No. PCT/CN2018/074556.

* cited by examiner

FIG. 14

ARRAY SUBSTRATE AND DISPLAY PANEL HAVING FORCE TFT

CROSS-REFERENCE TO RELATED APPLICATION

This is a National Phase Application filed under 35 U.S.C. 371 as a national stage of PCT/CN2018/074556, filed on Jan. 30, 2018, an application claiming the benefit of Chinese Patent Application No. 201710466119.1, filed on Jun. 19, 2017, the contents of which are incorporated herein by reference in the entirety.

TECHNICAL FIELD

The present application relates to the field of display technology, and particularly, relates to an array substrate and a method of fabricating the same, a display panel and a display device.

BACKGROUND

At present, flat panel display devices are becoming more and more popular in people's daily lives. Commonly used flat panel display devices include liquid crystal displays (LCDs) and organic light-emitting diode (OLED) display devices, and the flat panel display devices are more convenient for people to use.

With the development of science and technology, display screens integrated with pressure detection function have emerged, which enriches the intelligence of display screens and improves the human-computer interaction experience. The display screens integrated with pressure detection function can sense the amount of pressure pressed to the screen and implement different functions according to the sensed amount of pressure, thus providing an additional control dimension in addition to normal touch.

SUMMARY

The present disclosure provides an array substrate and a method of fabricating the same, a display panel and a display device.

In an aspect, the present disclosure provides an array substrate divided into a plurality of pixel regions, each of the pixel regions being provided with a pixel thin film transistor (TFT). At least one of the pixel regions is provided with a pressure component and a force TFT, the force TFT includes a first electrode, a second electrode and a control electrode, and the pressure component is connected to one of the first electrode and the control electrode of the force TFT. At least one of layer structures of the pixel TFT is disposed in the same layer as a corresponding layer structure of the force TFT.

In some embodiments, the pressure component includes a contact electrode, a pressure sensing layer, and a bias electrode stacked sequentially, and the contact electrode is connected to the one of the first electrode and the control electrode of the force TFT.

In some embodiments, an active layer of the pixel TFT is disposed in the same layer as an active layer of the force TFT, and a first electrode and a second electrode of the pixel TFT are disposed in the same layer as the first electrode and the second electrode of the force TFT. A control electrode of the pixel TFT is disposed at a side of the active layer of the pixel TFT facing the first electrode and the second electrode of the pixel TFT, and the control electrode of the force TFT is disposed at a side of the active layer of the force TFT facing away from the first electrode and the second electrode of the force TFT.

In some embodiments, the contact electrode has a patterned structure, and a portion of the contact electrode serves as the control electrode of the force TFT.

In some embodiments, the force TFT further includes a light shielding metal block disposed in the same layer as the control electrode of the pixel TFT and at least partially covering the active layer of the force TFT to shield light from irradiating on the active layer of the force TFT.

In some embodiments, the bias electrode is provided with an opening in a region corresponding to the active layer of the pixel TFT, and an orthographic projection of the active layer of the pixel TFT on a plane where the bias electrode is located at least partially overlaps with the opening.

In some embodiments, an active layer of the pixel TFT is disposed in the same layer as an active layer of the force TFT, the first electrode and the second electrode of the pixel TFT are disposed in the same layer as the first electrode and the second electrode of the force TFT, and the control electrode of the pixel TFT is disposed in the same layer as the control electrode of the force TFT.

In some embodiments, the one of the first electrode and the control electrode of the force TFT has a portion extending in a vertical direction and is connected to the contact electrode through the portion.

In some embodiments, the contact electrode has a portion extending in a vertical direction and is connected to the one of the first electrode and the control electrode of the force TFT through the portion.

In some embodiments, at least one of the bias electrode and the pressure sensing layer has a plate structure.

In some embodiments, at least one of the bias electrode and the pressure sensing layer has a grid structure.

In another aspect, the present disclosure provides a display panel including the above array substrate.

In some embodiments, the display panel further includes a display component connected to the second electrode of the pixel TFT, the display component being at one side of the active layers of the force TFT and the pixel TFT and the pressure component being at the other side of the active layers of the force TFT and the pixel TFT.

In some embodiments, the display component and the pressure component are at one side of the active layers of the force TFT and the pixel TFT, the display component includes at least a light emitting layer disposed in the same layer as the pressure sensing layer, and a cathode electrode of the display component and the bias electrode of the pressure component are disposed in a same layer and formed as an integral structure.

In another aspect, the present disclosure provides a display panel divided into a plurality of pixel regions. The display panel includes: a pixel TFT disposed in each of the plurality of pixel regions; a pressure component and a force TFT disposed in at least one of the plurality of pixel regions, the force TFT including a first electrode, a second electrode, and a control electrode, the pressure component being connected to one of the first electrode and the control electrode of the force TFT, and the pressure component including at least a pressure sensing layer; and a display component including at least a light emitting layer. The light emitting layer and the pressure sensing layer are configured to allow the pressure sensing layer not to be patterned.

In some embodiments, the pixel TFT and the display component are provided as a display substrate, the force TFT and the pressure component are provided as a sensing substrate, and the display substrate is attached to the sensing substrate.

In some embodiments, the light emitting layer and the pressure sensing layer are disposed at different sides of the display panel to allow the pressure sensing layer not to be patterned.

In another aspect, the present disclosure provides a method of fabricating an array substrate, the array substrate being divided into a plurality of pixel regions. The method includes: forming a pixel TFT in each of the plurality of pixel regions; and forming a pressure sensor in at least one of the plurality of pixel regions, the pressure sensor including a pressure component and a force TFT, the force TFT including a first electrode, a second electrode and a control electrode, and the pressure component being connected to one of the first electrode and the control electrode of the force TFT. At least one of layer structures of the pixel TFT and a corresponding layer structure of the force TFT are formed in a same patterning process.

In another aspect, the present disclosure provides a display device including the above display panel.

DETAILED DESCRIPTION

To make those skilled in the art better understand the technical solutions of the present disclosure, the array substrate and the method of fabricating the same, the display panel and the display device of the present disclosure will be further described in detail below in conjunction with the accompanying drawings and specific embodiments.

In the present disclosure, a photolithography process refers to a process of forming a pattern by using a photoresist, a mask, an exposure machine, or the like, including a process of exposure, development, etching, etc., and a patterning process includes the photolithography process and also includes other processes of forming a predetermined pattern, such as printing, inkjet, and the like.

In the present disclosure, "disposed in a/the same layer(s)" refers to being disposed by a same patterning process using a same mask.

In the present disclosure, a "layer structure" of a TFT refers to a structure of a single element (for example, a gate electrode, a source electrode, a drain electrode, an active layer, an insulation layer, or the like) of a transistor formed in one patterning process or a plurality of sequential patterning processes.

In the present disclosure, a "patterned structure" refers to a structure having a certain pattern and subjected to a patterning process.

In the existing 3D touch scheme, which is an implementation of display pressure detection, a dimension of a third direction (usually a Z axis) is added on the basis of the touch function, thereby adding the action and function of being controlled by pressure. However, in the current 3D touch mode, the pressure detection typically requires positioning with the aid of a touch structure first, to provide a pressure signal at a predetermined position. In addition, a combination of the pressure detection structure and the touch structure makes it difficult to achieve high-precision pressure detection, so the pressure detection is rough, and it is difficult to provide a more delicate touch experience. Therefore, how to achieve high-precision pressure detection and provide a more delicate touch experience while simplifying the structure and fabrication method has become a technical problem to be solved urgently.

Accordingly, the present disclosure provides an array substrate and a method of fabricating the same, a display panel and a display device to obviate one or more of the problems in the related art.

In an aspect, embodiments of the present disclosure provide an array substrate and a display panel including the same. In the array substrate, in view of the problems of complex structure, excessive steps of fabrication process, and high mask cost for the existing force sensor and display integration with a function of active matrix pressure detection, a force TFT and a pixel TFT are disposed in a same layer and fabricated in this way, thereby effectively saving the masks and avoiding a process of fine patterning of pressure sensitive material.

The array substrate is divided into a plurality of pixel regions, each of the pixel regions being provided with a pixel TFT. At least one of the pixel regions is provided with a pressure component and a force TFT, the force TFT includes a first electrode, a second electrode and a control electrode, and the pressure component is connected to one of the first electrode and the control electrode of the force TFT. At least one of layer structures of the pixel TFT is disposed in the same layer as a corresponding layer structure of the force TFT.

Figure 1A:
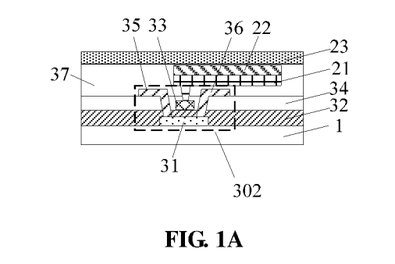
FIGS. 1A and 1B are a cross-sectional view and an equivalent circuit diagram of a pressure sensor according to an embodiment of the present disclosure, respectively.
Figure 2A:
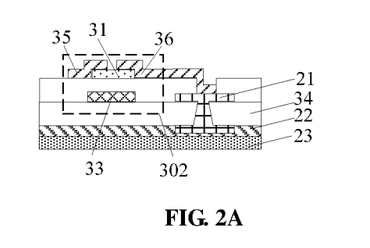
FIGS. 2A and 2B are a cross-sectional view and an equivalent circuit diagram of another pressure sensor according to an embodiment of the present disclosure, respectively.

FIG. 1A or 2A illustrates a typical structure of a pressure sensor according to an embodiment of the present disclosure. Referring to FIGS. 1A and 2A, the pressure component includes a contact electrode 21, a pressure sensing layer 22, and a bias electrode 23 stacked sequentially, and the contact electrode 21 is connected to the first electrode or the control electrode of a force TFT 302. For example, the force TFT 302 in FIG. 1A has a top-gate structure, the contact electrode 21 is connected to the control electrode of the force TFT 302, and the pressure sensing layer 22 and the bias electrode 23 are sequentially arranged on the contact electrode 21. For example, the force TFT 302 in FIG. 2A has a bottom-gate structure, the contact electrode 21 is connected to the first electrode of the force TFT 302, and the pressure sensing layer 22 and the bias electrode 23 are sequentially arranged under the contact electrode 21. FIG. 1A is intended to illustrate a case where the pressure component is connected to the control electrode of the force TFT 302 and FIG. 2A is intended to illustrate a case where the pressure component is connected to the first electrode of the force TFT 302, while the force TFT 302 is not limited to have a top-gate structure or a bottom-gate structure. That is, it can refer to the structure in FIG. 1A in a case where the pressure component is connected to the control electrode of the force TFT 302 having a top-gate structure or a bottom-gate structure, and refer to the structure in FIG. 2A in a case where the pressure component is connected to the first electrode of the force TFT 302 having a top-gate structure or a bottom-gate structure.

The pressure component may be implemented as a simple structure with three layers including the contact electrode 21, the bias electrode 23, and the pressure sensing layer 22 interposed therebetween. For example, the pressure component may be formed to be a sandwich structure with a layer of pressure sensitive material sandwiched therein, or a sandwich structure with a layer of deformable dielectric material sandwiched therein. That is, the pressure sensing layer 22 may be implemented by pressure sensitive material or capacitor deformation, and the pressure sensitive material may be piezoelectric material or piezoresistive material.

In the pressure sensor according to the embodiments of the present disclosure in which the pressure component with three layers is combined with the force TFT 302, the pressure is sensed by the pressure component, and a position where a pressure force is applied and an amount of pressure at this position are determined directly by whether a state of the force TFT 302 changes.

Figure 1B:
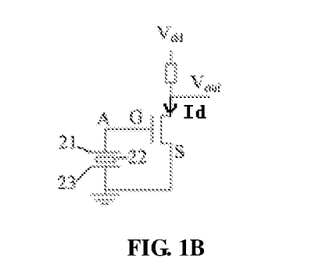

In the structure of the pressure sensor as illustrated in FIG. 1A, one electrode in the sandwich structure is connected to the gate electrode 33 of the force TFT to form the contact electrode 21, and the other electrode in the sandwich structure is the bias electrode 23. FIG. 1B illustrates an equivalent circuit diagram of the pressure sensor as illustrated in FIG. 1A. Referring to FIGS. 1A and 1B, when a pressure force is applied on the pressure sensing layer 22, a level at the node A changes, and thus a level at the gate electrode 33 changes and the gate-source voltage Vgs changes. Thus, a changed current or voltage signal (a voltage signal $V_{out}$ is illustrated in FIG. 1B) is obtained at the output terminal 'out' to determine the pressure position and/or the amount of pressure. In this structure, an output current signal Id (i.e., the current flowing through the transistor 302 in FIG. 1B) has a dependency on the change of Vgs caused by the pressure in a square power relationship, as shown in Equation (1):

$$I_d = \frac{1}{2}\mu_n C_{ox}\frac{W}{L}(V_{gs} - V_{TH})^2, \quad \text{Equation (1)}$$

where $\mu_n$ is the mobility of carriers, $C_{ox}$ is the capacitance of the gate oxide film per unit area, W/L is the width-to-length ratio of the channel, $V_{gs}$ is the gate-source voltage, and $V_{TH}$ is the threshold voltage. According to Equation (1), the structure in which the pressure component is connected to the gate electrode of the force TFT can realize an internal amplification of the pressure-dependent signal (e.g., the level at the node A).

Figure 2B:
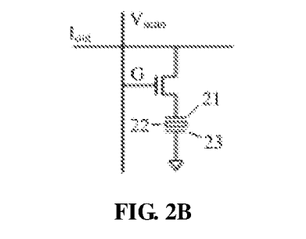

In the structure of the pressure sensor as illustrated in FIG. 2A, one electrode in the sandwich structure is connected to the source electrode 36 of the force TFT to form the contact electrode 21, and the other electrode in the sandwich structure is the bias electrode 23. FIG. 2B illustrates an equivalent circuit diagram of the pressure sensor as illustrated in FIG. 2A. Referring to FIGS. 2A and 2B, when a pressure force is applied on the pressure sensing layer 22, a level at the source electrode 36 changes, and the gate-source voltage Vgs changes. Thus, a changed current or voltage signal (a current signal $I_{out}$ is illustrated in FIG. 2B) is obtained at the output terminal 'out' to determine the pressure position and/or the amount of pressure.

In the force TFT 302 illustrated in FIG. 2A, the control electrode refers to the gate electrode 33, the first electrode refers to the source electrode 36, and the second electrode refers to the drain electrode 35. The source electrode 36 and the drain electrode 35 are disposed in a same layer, and may exchange their roles with each other in terms of function. In other words, FIG. 2A illustrates the case where the first electrode of the force TFT is the source electrode 36, but the present application is not limited thereto, and the first electrode may be either the source electrode or the drain electrode. In the example illustrated in FIG. 2A, the sandwich structure of the pressure component is connected to the source electrode 36 of the force TFT 302, that is, an internal amplification of the pressure-dependent signal (e.g., the level at the source electrode 36) can be realized when the pressure component is connected to the first electrode of the force TFT.

Figure 3:
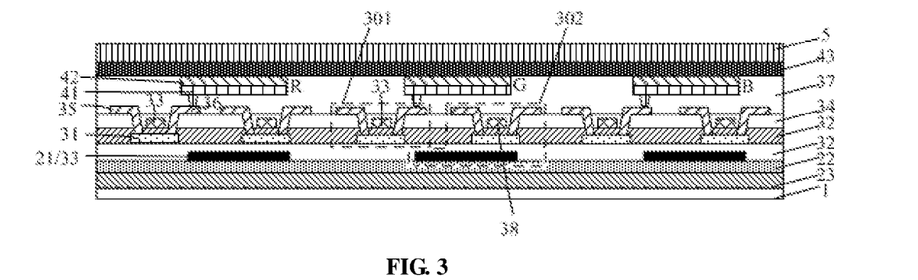
FIG. 3 is a cross-sectional view of a display panel including an array substrate according to an embodiment of the present disclosure.

FIG. 3 illustrates a display panel including the above array substrate according to an embodiment of the present disclosure. As illustrated in FIG. 3, the display panel according to an embodiment of the present disclosure includes the array substrate, a display component, and an encapsulation layer 5. In the display panel, an active layer 31 of the pixel TFT 301 is disposed in the same layer as the active layer 31 of the force TFT 302, and the drain electrode 35 and the source electrode 36 of the pixel TFT 301 are disposed in the same layer as the drain electrode 35 and the source electrode 36 of the force TFT 302. The pixel TFT 301 has a top-gate structure in which the gate electrode 33 of the pixel TFT 301 is disposed on the active layer 31, and the force TFT 302 has a bottom-gate structure in which the gate electrode 33 of the force TFT 302 is disposed under the active layer 31. The display component is connected to the source electrode 36 of the pixel TFT 301, the contact electrode 21 of the pressure component is connected to the gate electrode 33 of the force TFT 302, and the display component and the pressure component are at upper and lower sides of the active layers 31 of the thin film transistors 301 and 302, respectively.

In the pressure component according to the embodiments of the present disclosure, the contact electrode 21 has a patterned structure, and a portion of the contact electrode 21 serves as the gate electrode 33 of the force TFT. That is, the contact electrode 21 and the gate electrode 33 of the force TFT 302, which are connected to each other, have an integral structure and a common function. The active layers and the source/drain layers of the pixel TFT 301 and the force TFT 302 are disposed in a same layer and fabricated in a same patterning process, and the gate electrodes of the pixel TFT 301 and the force TFT 302 disposed in different layers are fabricated either later or earlier, that is, the gate electrode of the force TFT 302 is fabricated prior to the fabrication of the active layers and the source/drain layers while the gate electrode of the pixel TFT 301 is fabricated subsequent to the fabrication of the active layers and the source/drain layers. In this manner, the top-gate pixel TFT 301 and the bottom-gate force TFT 302 are implemented, and the pressure component can be disposed under the force TFT 302 and at a different side of the TFT from the display component, which makes the patterning of the pressure sensing layer not inevitable any more, and makes the active layers and the source/drain layers of the pixel TFT 301 and the force TFT 302 to be fabricated in a same layer, thereby effectively saving masks. The display component may be an OLED display device and a LCD display device. In some embodiments, the display panel may be an OLED display screen, and particularly may be a flexible OLED display screen. FIG. 3 illustrates an example where the display component is an OLED device, and in a case where the display component is a LED device, the display component may be disposed accordingly with reference to the connection between the OLED device and the pixel TFT 301. As illustrated in FIG. 3, the OLED device includes at least an anode electrode 51, a light emitting layer 42 and a cathode electrode 43 which are stacked.

Figure 4:
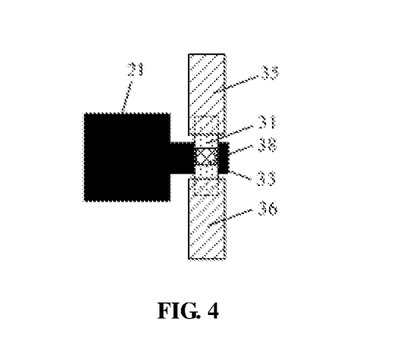
FIG. 4 is a partial plan view illustrating a force TFT and a corresponding contact electrode of the display panel in FIG. 3.

As illustrated in FIG. 4, the force TFT 302 further includes a light shielding metal block 38 disposed in the same layer as the gate electrode 33 of the pixel TFT 301 and at least partially covering the active layer of the force TFT to shield light from irradiating on the active layer 31 of the force TFT 302. The light shielding metal block 38 is disposed in a region of the force TFT 302 corresponding to the gate electrode 33 of the pixel TFT 301 in a floating manner, and ensures the performance of the force TFT 302 by shielding the active layer 31 of the force TFT 302 from light.

In the display panel according to the embodiments of the present disclosure, the display component is at one side of the active layer 31 and the pressure component is at the other side of the active layer 31, thereby avoiding the patterning of the pressure sensing layer which is inevitable in a case of the pressure sensing layer and the light emitting material being at one side of the active layer. In some embodiments, the bias electrode 23 and/or pressure sensing layer 22 of the pressure component has a plate structure or a grid structure. It can prevent an entire layer of material from falling off when one or both of the bias electrode 23 and the pressure sensing layer 22 are arranged in a grid shape.

Figure 5:
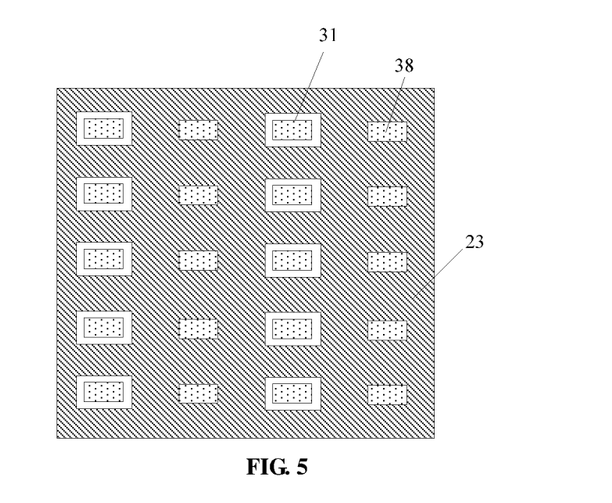
FIG. 5 is a partial plan view illustrating a bias electrode, a light shielding metal block, and an active layer of a pixel TFT of the display panel in FIG. 3.

As illustrated in FIG. 5, the bias electrode 23 is provided with an opening in a region corresponding to the active layer 31 of the pixel TFT 301, and an orthographic projection of the active layer 31 of the pixel TFT 301 on a plane where the bias electrode 23 is located at least partially overlaps with the opening. That is, the opening (which may be formed by an etching process) is provided in a region of the bias electrode 23 corresponding to the active layer 31 to avoid adversely affecting the performance of the pixel TFT 301.

As illustrated in FIG. 3, the display panel further includes a display component, and the display component is at one side of the active layer 31 and the pressure component is at the other side of the active layer 31. The display component is connected to the source electrode 36 of the pixel TFT 301. In FIG. 3, the display component is at one side of the active layer 31 and the pressure component is at the other side of the active layer 31, and thus allows the pressure sensing layer not to be patterned. In some embodiments, the display component and the pressure component may be at one side of the active layer 31.

In the pixel TFT 301 and the force TFT 302, the active layer 31 is formed of an LTPS material, an a-Si material, or an IGZO material.

Accordingly, the embodiments of the present disclosure further provide a method of fabricating an array substrate, the array substrate being divided into a plurality of pixel regions. The method includes forming the pixel TFT 301 in each of the plurality of pixel regions, and forming a pressure sensor in at least one of the plurality of pixel regions. The pressure sensor includes a pressure component and a force TFT 302, the force TFT 302 includes a first electrode, a second electrode and a control electrode, and the pressure component is connected to one of the first electrode and the control electrode of the force TFT 302. At least one of layer structures of the pixel TFT 301 and a corresponding layer structure of the force TFT 302 are disposed in a same layer and formed in a same patterning process. In the array substrate, the layer structures of the pixel TFT 301 and the force TFT 302 may be formed in a same patterning process using a same mask, thereby simplifying the process and saving the masks.

Hereinafter, in the embodiment of the present disclosure, the method of fabricating the array substrate will be described in detail by taking a case of forming low-temperature polycrystalline (LTPS) TFT structure by a patterning process as an example.

First, the bias electrode 23 is prepared on the substrate 1. The bias electrode 23 is not inevitably patterned, that is, it may be formed to have a plate structure. Needless to say, in order to reduce the influence on the pixel TFT 301, the bias electrode 23 may also have a grid shape to avoid overlapping with the region right under the active layer 31 of the pixel TFT 301, that is, the bias electrode 23 may be formed to have a structure whose top view is illustrated in FIG. 5. In this case, the conductive material for forming the bias electrode 23 in the region under the active layer 31 of the pixel TFT 301 is etched off.

Next, a layer of pressure sensitive material or deformable dielectric material is formed on the bias electrode 23 as the pressure sensing layer 22. This layer of material may be coated entirely on the bias electrode 23, or attached on the bias electrode 23 as a film. The pressure sensing layer 22 does not have to be patterned. Needless to say, considering that the entire layer of material is easy to fall off in the process, the pressure sensing layer 22 may also be arranged in a grid shape as long as it is allowed by the patterning process, but there is no special requirement for the precision of the patterning process, and a precision of hundreds of microns to several millimeters is acceptable.

Then, a patterned contact electrode 21 is prepared on the pressure sensing layer 22, and a portion of the contact electrode 21 serves as the gate electrode 33 of the force TFT 302, the top view thereof referring to FIG. 4. The light shielding metal block 38 is formed in a region of the force TFT 302 corresponding to the gate electrode 33 of the pixel TFT 301.

Finally, the structure of the TFT is formed according to the conventional process, and a first insulation layer 32, the active layers 31 in a same layer, a second insulation layer 34, the gate electrode 33 of the force TFT 302, the drain electrodes 35/source electrodes 36 in a same layer, a third insulation layer, and the like are formed sequentially.

In the above process flow, the force TFT 302 is formed to have a bottom-gate structure, that is, the gate electrode 33 of the force TFT 302 is under the active layer 31, and the pixel TFT 301 is formed to have a top-gate structure, that is, the gate electrode 33 of the pixel TFT 301 is on the active layer 31.

Figure 6:
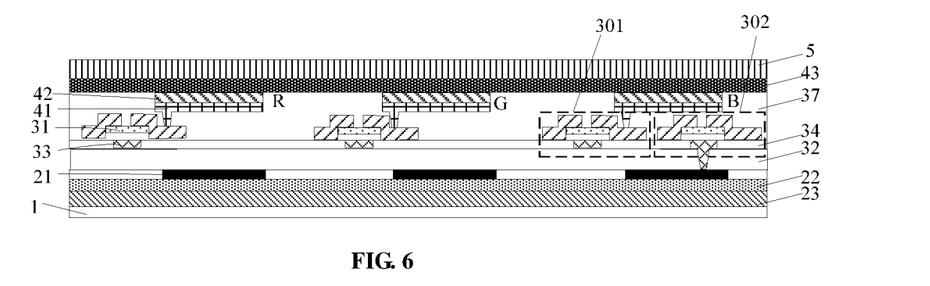
FIGS. 6 and 7 are cross-sectional views of a display panel including an array substrate according to an embodiment of the present disclosure.
Figure 7:
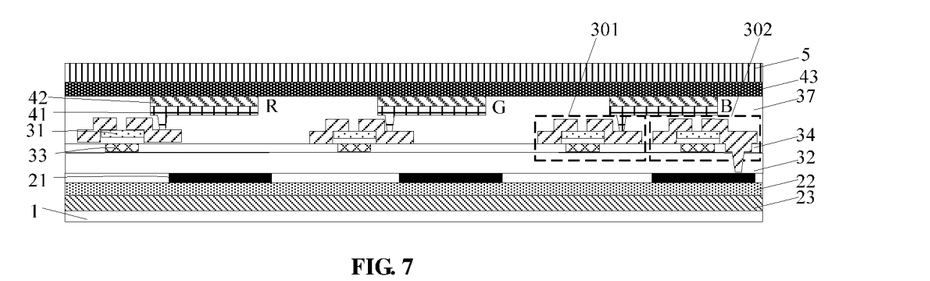

FIGS. 6 and 7 illustrate a display panel including an array substrate according to an embodiment of the present disclosure. The display panel illustrated in FIGS. 6 and 7 differs from the display panel illustrated in FIG. 3 in the structures of the pixel TFT and the force TFT, and the connection between the pressure component and the force TFT.

As illustrated in FIGS. 6 and 7, the pixel TFT 301 and the force TFT 302 have the same layer structures, in which the active layers 31 of the pixel TFT 301 and the force TFT 302 are disposed in a same layer, the first and second electrodes of the pixel TFT 301 and the force TFT 302 are disposed in a same layer, and the gate electrodes 33 of the pixel TFT 301 and the force TFT 302 are disposed in a same layer. The pixel TFT 301 has a bottom-gate structure, and the force TFT 302 has a bottom-gate structure. The bias electrode 23 is not inevitably patterned, that is, it may be formed to have a plate structure. Needless to say, in order to reduce the influence on the pixel TFT 301, the bias electrode 23 may also have a grid shape to avoid overlapping with the region right under the active layer 31 of the pixel TFT 301, that is, the bias electrode 23 may be formed to have a structure whose top view is illustrated in FIG. 5. The display component is connected to the source electrode 36 of the pixel TFT 301, the pressure component is connected to the gate electrode 33 of the force TFT 302, and the display component and the pressure component are at different sides of the active layer 31, respectively.

Hereinafter, the method of fabricating a display panel will be described in detail with reference to the display panel including the bottom-gate pixel TFT and force TFT as illustrated in FIG. 6.

First, the bias electrode 23 is prepared on the substrate 1, and the top view thereof may refer to FIG. 5. The bias electrode 23 may be a plate electrode.

Next, a layer of pressure sensitive material or deformable dielectric material is formed on the bias electrode 23 as the pressure sensing layer 22. This layer of material may be coated entirely on the bias electrode 23, or partially patterned to ensure process compatibility. Likewise, this layer has no special requirement for the precision of the patterning process, and a precision of hundreds of microns to several millimeters is acceptable.

Then, a patterned contact electrode 21 is prepared on the pressure sensing layer 22.

Finally, the first insulation layers 32 of the TFTs and vias of the insulation layers are formed by the conventional process, and structures of the TFTs such as the gate electrodes disposed in the same layer, the second insulation layers 34, the active layers 31 disposed in the same layer, the drain electrodes 35/source electrodes 36 disposed in the same layer and the third insulation layers 37, and the display component are formed sequentially on the first insulation layers 32. The gate electrode 33 of the force TFT 302 has a portion extending in a vertical direction and within the via of the insulating layer, and the gate electrode 33 of the force TFT 302 is connected to the contact electrode 21 of the pressure component through the portion. Here, the vertical direction refers to a direction different from a horizontal direction, for example, a direction substantially perpendicular to the horizontal direction.

An embodiment of the bottom-gate pixel TFT 301 and the bottom-gate force TFT 302 may also be as illustrated in FIG. 7, in which the source electrode 36 of the pixel TFT 301 is connected to the display component, the source electrode 36 of the force TFT 302 has a portion extending in the vertical direction and within the via of the insulating layer, and the source electrode 36 of the force TFT 302 is connected to the contact electrode 21 of the pressure component through the portion.

Figure 8:
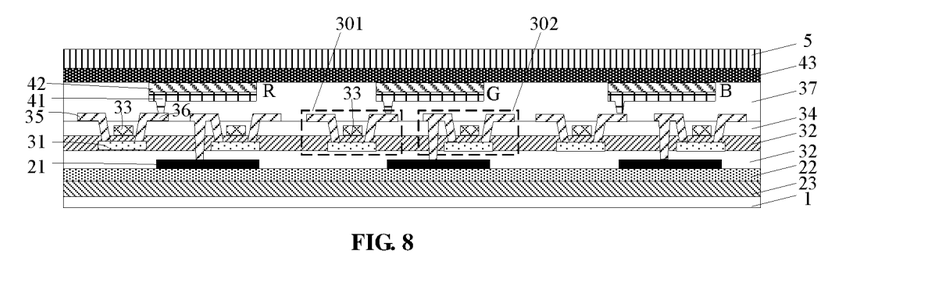
FIGS. 8 and 9 are cross-sectional views of a display panel including an array substrate according to an embodiment of the present disclosure.
Figure 9:
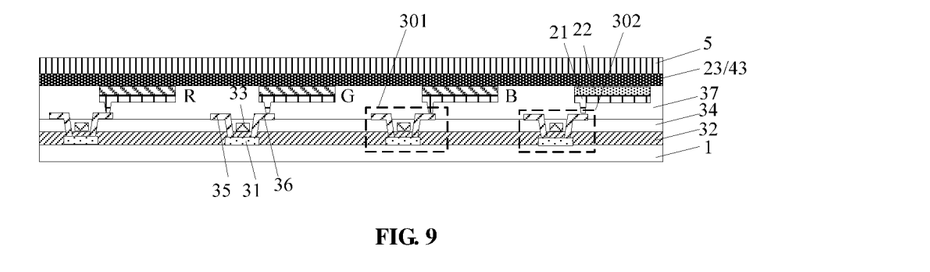

FIGS. 8 and 9 illustrate a display panel including an array substrate according to an embodiment of the present disclosure. The display panel illustrated in FIGS. 8 and 9 differs from the display panels illustrated in FIGS. 3, 6 and 7 in the structures of the pixel TFT and the force TFT, and the connection between the pressure component and the force TFT.

As illustrated in FIG. 8, the pixel TFT 301 and the force TFT 302 have the same layer structures, in which the active layers 31 of the pixel TFT 301 and the force TFT 302 are disposed in a same layer, the first and second electrodes of the pixel TFT 301 and the force TFT 302 are disposed in a same layer, and the gate electrodes 33 of the pixel TFT 301 and the force TFT 302 are disposed in a same layer. The pixel TFT 301 has a top-gate structure, and the force TFT 302 has a top-gate structure. The display component is connected to the source electrode 36 of the pixel TFT 301, the pressure component is connected to the drain electrode 35 of the force TFT 302, and the display component and the pressure component are at different sides of the active layer 31. The bias electrode 23 in FIG. 8 is not inevitably patterned, and it may be formed by coating entirely.

An embodiment of the top-gate pixel TFT 301 and the top-gate force TFT 302 may also be as illustrated in FIG. 9. In the display panel as illustrated in FIG. 9, the display component and the pressure component are disposed at one side of the active layer 31, and the pressure sensing layer 22 needs to be patterned. In FIG. 9, the display component is connected to the source electrode 36 of the pixel TFT 301, the pressure component is connected to the source electrode 36 of the force TFT 302, and a cathode electrode 43 of the display component and the bias electrode 23 of the pressure component are disposed in a same layer and formed as an integral structure (that is, the cathode electrode 43 and the bias electrode 23 are formed as an integral layer). The display component includes at least a light emitting layer 42 disposed in the same layer as the pressure sensing layer 22. The light emitting layer 42 and the pressure sensing layer 22 disposed in the same layer may further simplify the process.

Figure 10:
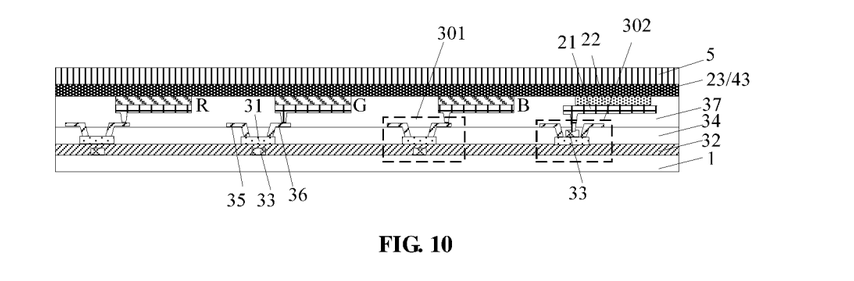
FIG. 10 is a cross-sectional view of a display panel including an array substrate according to an embodiment of the present disclosure.

FIG. 10 illustrates a display panel including an array substrate according to an embodiment of the present disclosure. The display panel illustrated in FIG. 10 differs from the display panels illustrated in FIGS. 3 and 6 to 9 in the structures of the pixel TFT and the force TFT, and the connection between the pressure component and the force TFT.

As illustrated in FIG. 10, the pixel TFT 301 and the force TFT 302 have the same layer structures, in which the active layers 31 of the pixel TFT 301 and the force TFT 302 are disposed in a same layer, the first and second electrodes of the pixel TFT 301 and the force TFT 302 are disposed in a same layer, and the gate electrodes 33 of the pixel TFT 301 and the force TFT 302 are disposed in a same layer. The pixel TFT 301 has a bottom-gate structure, and the force TFT 302 has a top-gate structure. The display component is connected to the source electrode 36 of the pixel TFT 301, and the pressure component is connected to the gate electrode 33 of the force TFT 302. The pressure sensing layer 22 needs to be patterned, and the cathode electrode 43 of the display component and the bias electrode 23 of the pressure component are disposed in a same layer. The display component includes at least a light emitting layer 42 disposed in the same layer as the pressure sensing layer 22. The light emitting layer 42 and the pressure sensing layer 22 disposed in the same layer may further simplify the process.

In the array substrates and the display panels illustrated in FIGS. 1 to 10, according to the stacking process in the above embodiments, the force TFT 302 and the pixel TFT 301 may be fabricated to be in the same layer. In addition, as illustrated in FIGS. 9 and 10, the cathode electrode of the display component and the bias electrode of the pressure component may be disposed in a same layer to save steps of processes.

Although the array substrates and the display panels illustrated in FIGS. 1 to 10 are not identical, the pressure sensor of each of the array substrates and the display panels is connected to the gate electrode 33 or the source electrode 36/drain electrode 35 of the force TFT 302 through the contact electrode 21, and follows a same pressure detection principle. That is, when a pressure force is applied, the pressure sensitive material changes correspondingly (for example, the piezoelectric material generates a voltage signal or the resistance of the piezoresistive material changes), which results in that a voltage at the gate electrode 33 or the source electrode 36/drain electrode 35 changes and thus a changed output current or voltage is obtained, thereby realizing the pressure detection. In practice application, different types of combination can be selected as needed, which are not limited herein.

In the array substrate according to the embodiments of the present disclosure, by disposing the force TFT and the pixel TFT in the same layer and fabricating corresponding layer structures in a same fabrication process, high-precision pressure detection is achieved to provide a more delicate touch experience, while the structure and fabrication method of the array substrate are simplified.

In another aspect, embodiments of the present disclosure provide a display panel. The display panel is divided into a plurality of pixel regions, and includes: a pixel TFT disposed in each of the plurality of pixel regions; a pressure component and a force TFT disposed in at least one of the plurality of pixel regions, the force TFT including a first electrode, a second electrode, and a control electrode, the pressure component being connected to one of the first electrode and the control electrode of the force TFT, and the pressure component including at least a pressure sensing layer; and a display component including at least a light emitting layer. The light emitting layer and the pressure sensing layer are configured to allow the pressure sensing layer not to be patterned.

In some embodiments, the display panel is formed by adhesively attaching a display substrate to a sensing substrate.

In some embodiments, the pixel TFT and the display component forms the display substrate, and the pixel TFT may have either a top-gate structure or a bottom-gate structure. The force TFT and the pressure component forms the sensing substrate, the force TFT may have either a top-gate structure or a bottom-gate structure, and the pressure sensing layer does not need to be patterned. After the display substrate and the sensing substrate have been prepared, respectively, they are attached to each other to form the display panel.

Figure 11:
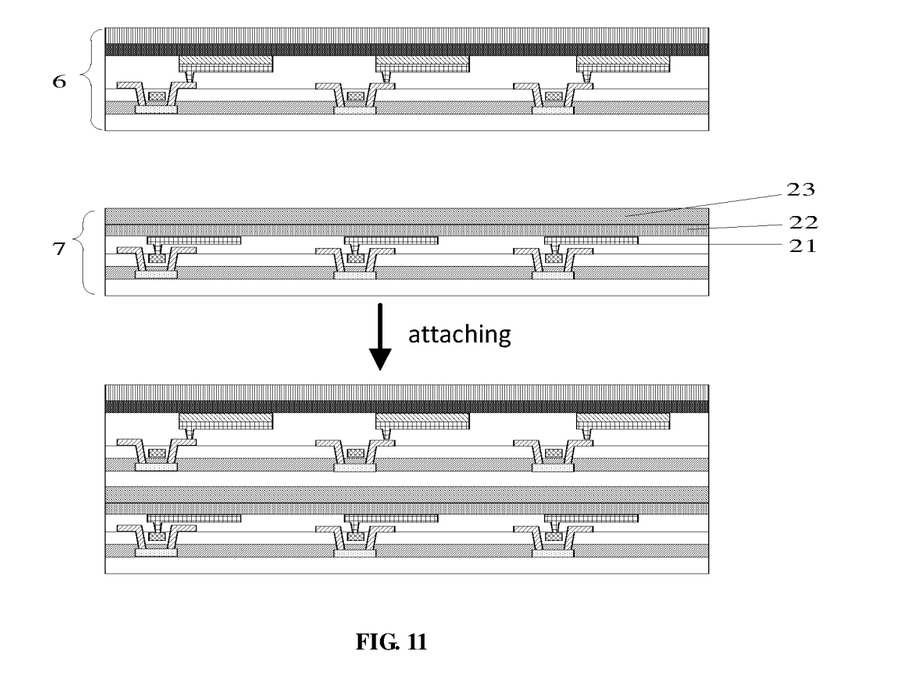
FIGS. 11 to 13 are cross-sectional views of a display panel according to an embodiment of the present disclosure.

FIGS. 11 to 13 illustrate some examples. In the display panel illustrated in FIG. 11, a top-gate pixel transistor 301 and a top-gate force TFT 302 are provided, the display component is on the pixel TFT 301, the pressure component is on the force TFT 302, and the sensing substrate 7 is attached under the display substrate 6.

Figure 12:
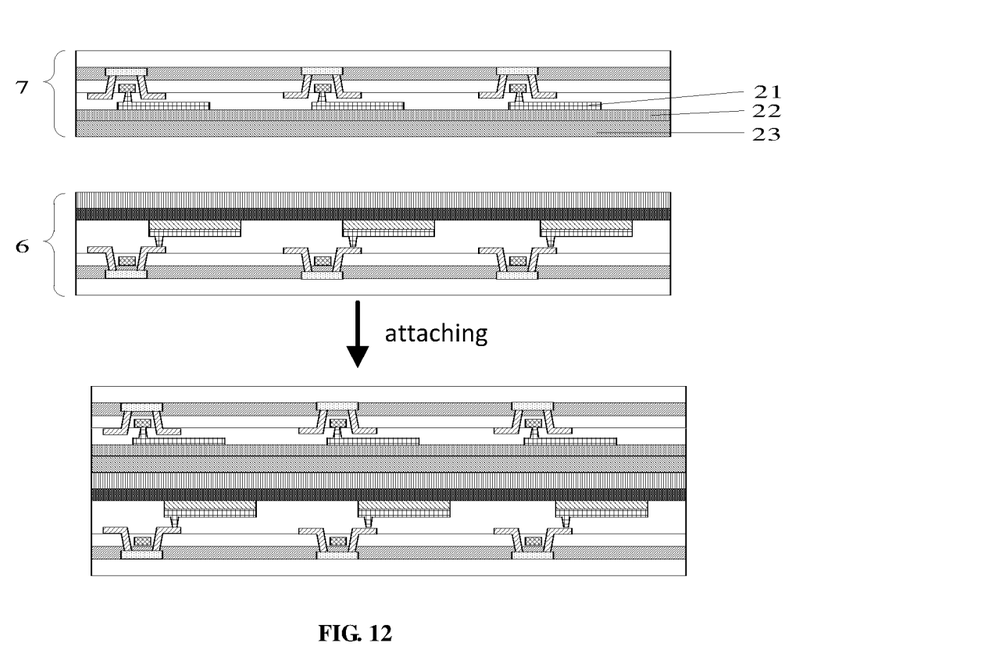

In the display panel illustrated in FIG. 12, a top-gate pixel transistor 301 and a top-gate force TFT 302 are provided, the display component is on the pixel TFT 301, the pressure component is on the force TFT 302, and the sensing substrate 7 is attached on the display substrate 6. In this structure, an orthographic projection of the force TFT 302 needs to fall into a non-light emitting region after the attaching so as to not affect the display, and the material of the pressure sensing layer 22 is transparent, such as a transparent piezoelectric film.

Figure 13:
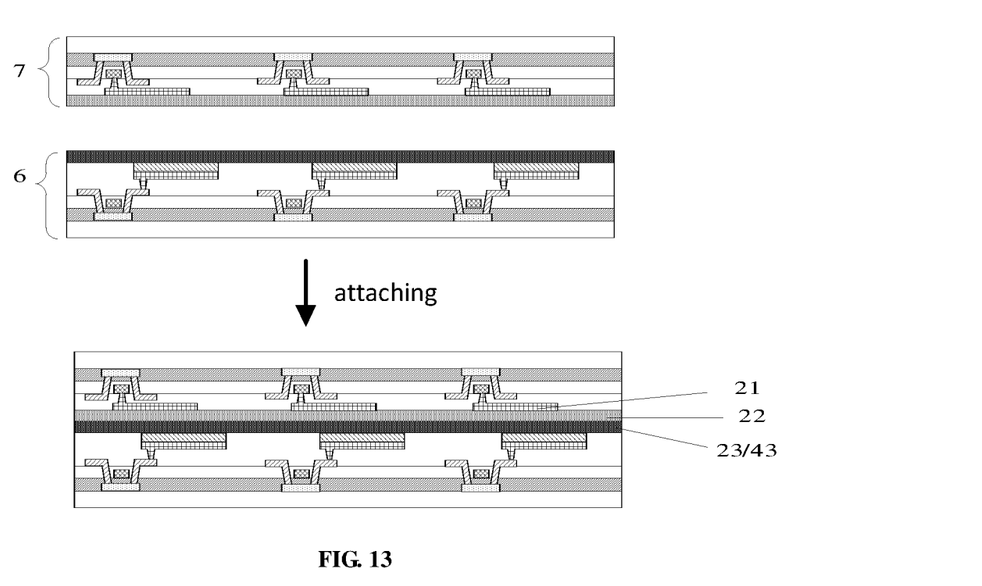
Figure 14:
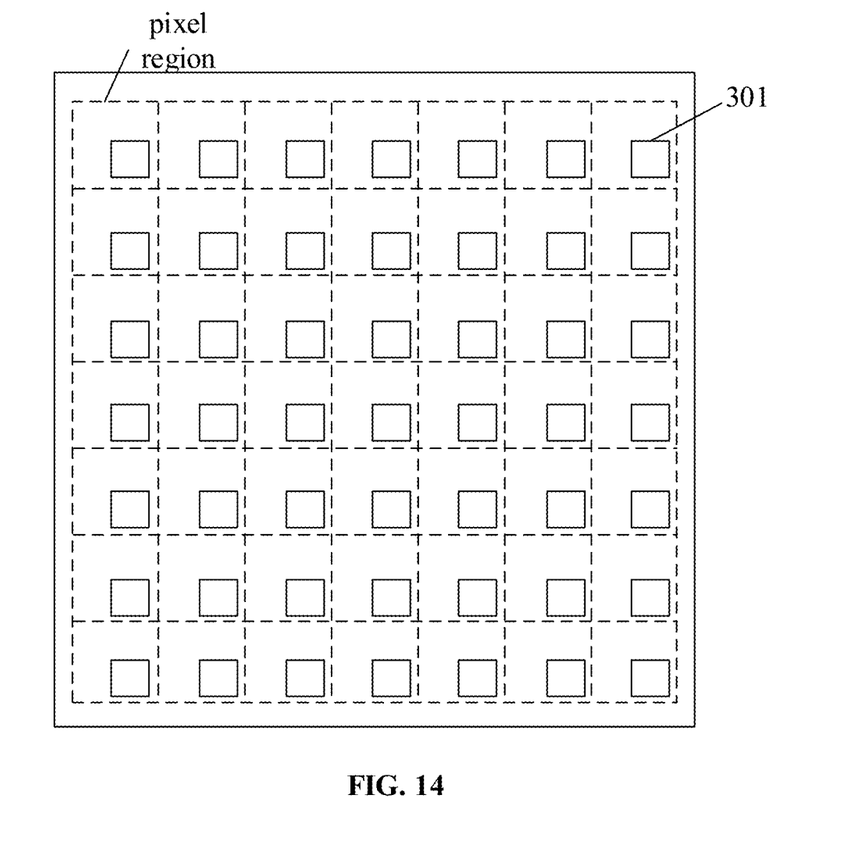
FIG. 14 is a schematic diagram of an array substrate illustrating pixel regions, according to an embodiment of the present disclosure.

In the display panel illustrated in FIG. 13, a top-gate pixel transistor 301 and a top-gate force TFT 302 are provided, the display component is on the pixel TFT 301, the pressure component is on the force TFT 302, and the cathode electrode of the display substrate and the bias electrode of the pressure component are disposed in a same layer to save steps of processes. The pressure sensing layer 22 is entirely exposed to outside in the fabrication of the sensing substrate 7, the cathode electrode 43 is exposed to outside in the fabrication of the display substrate 6, and the sensing substrate 7 is attached onto the display substrate 6, so the pressure sensing layer 22 contacts the cathode electrode 43, and the cathode electrode 43 of the display substrate 6 and the bias electrode 23 of the pressure component of the sensing substrate 7 are disposed in the same layer to save steps of processes. In this structure, an orthographic projection of the force TFT 302 needs to fall into a non-light emitting region after the attaching so as to not affect the display, and the material of the pressure sensing layer 22 is transparent, such as a transparent piezoelectric film.

In some embodiments, the light emitting layer and the pressure sensing layer are disposed at different sides of the display panel to allow the pressure sensing layer not to be patterned. Examples of the display panel may refer to FIGS. 3, 6-8, and 11, and the description thereof is not repeated herein.

In another aspect, embodiments of the present disclosure provide a display device including any of the above display panels.

The display device may be any product or component with a function of display, such as a desktop computer, a tablet computer, a laptop computer, a mobile phone, a PDA, a GPS, an on-board display, a projection display, a video camera, a digital camera, an electronic watch, a calculator, an electronic instrument, a gauge, a liquid crystal panel, an electronic paper, a television, a monitor, a digital photo frame, a navigator, or the like, and can be applied to many fields such as public display and virtual display.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. An array substrate, which is divided into a plurality of pixel regions, each of the pixel regions being provided with a pixel thin film transistor (TFT), wherein at least one of the pixel regions is provided with a pressure component and a force TFT, the pressure component comprises a pressure sensitive material and is configured to sense pressure, the force TFT comprises a first electrode, a second electrode and a control electrode, and the pressure component is connected to one of the first electrode and the control electrode of the force TFT such that a pressure-dependent electric signal is amplified, and at least one of layer structures of the pixel TFT is disposed in the same layer as a corresponding layer structure of the force TFT.

2. The array substrate of claim 1, wherein the pressure component comprises a contact electrode, a pressure sensing layer, and a bias electrode stacked sequentially, and the contact electrode is connected to the one of the first electrode and the control electrode of the force TFT.

3. The array substrate of claim 2, wherein an active layer of the pixel TFT is disposed in the same layer as an active layer of the force TFT, and a first electrode and a second electrode of the pixel TFT are disposed in the same layer as the first electrode and the second electrode of the force TFT, and
 a control electrode of the pixel TFT is disposed at a side of the active layer of the pixel TFT facing the first electrode and the second electrode of the pixel TFT, and the control electrode of the force TFT is disposed at a side of the active layer of the force TFT facing away from the first electrode and the second electrode of the force TFT.

4. The array substrate of claim 3, wherein the contact electrode has a patterned structure, and a portion of the contact electrode serves as the control electrode of the force TFT.

5. The array substrate of claim 3, wherein the force TFT further comprises a light shielding metal block disposed in the same layer as the control electrode of the pixel TFT and at least partially covering the active layer of the force TFT to shield light from irradiating on the active layer of the force TFT.

6. The array substrate of claim 3, wherein the bias electrode is provided with an opening in a region corresponding to the active layer of the pixel TFT, and an orthographic projection of the active layer of the pixel TFT on a plane where the bias electrode is located at least partially overlaps with the opening.

7. The array substrate of claim 2, wherein an active layer of the pixel TFT is disposed in the same layer as an active layer of the force TFT, a first electrode and a second electrode of the pixel TFT are disposed in the same layer as the first electrode and the second electrode of the force TFT, and a control electrode of the pixel TFT is disposed in the same layer as the control electrode of the force TFT.

8. The array substrate of claim 7, wherein the one of the first electrode and the control electrode of the force TFT has a portion extending in a vertical direction and is connected to the contact electrode through the portion.

9. The array substrate of claim 7, wherein the contact electrode has a portion extending in a vertical direction and is connected to the one of the first electrode and the control electrode of the force TFT through the portion.

10. The array substrate of claim 2, wherein at least one of the bias electrode and the pressure sensing layer has a plate structure.

11. The array substrate of claim 2, wherein at least one of the bias electrode and the pressure sensing layer has a grid structure.

12. A display panel, comprising the array substrate of claim 1.

13. The display panel of claim 12, further comprising a display component connected to a second electrode of the pixel TFT, the display component being at one side of the active layers of the force TFT and the pixel TFT and the pressure component being at the other side of the active layers of the force TFT and the pixel TFT.

14. The display panel of claim 12, further comprising a display component connected to a second electrode of the pixel TFT, the display component and the pressure component being at one side of the active layers of the force TFT and the pixel TFT,
 wherein the display component comprises at least a light emitting layer disposed in the same layer as the pressure sensing layer, and a cathode electrode of the display component and the bias electrode of the pressure component are disposed in a same layer and formed as an integral structure.

15. A display panel divided into a plurality of pixel regions, the display panel comprising:
 a pixel TFT disposed in each of the plurality of pixel regions;
 a pressure component and a force TFT disposed in at least one of the plurality of pixel regions, the pressure component comprising a pressure sensitive material and is configured to sense pressure, the force TFT comprising a first electrode, a second electrode, and a control electrode, the pressure component being connected to one of the first electrode and the control electrode of the force TFT such that a pressure-dependent electric signal is amplified, and the pressure component comprising at least a pressure sensing layer; and
 a display component comprising at least a light emitting layer,
 wherein the light emitting layer and the pressure sensing layer are configured to allow the pressure sensing layer not to be patterned.

16. The display panel of claim 15, wherein the pixel TFT and the display component are provided as a display substrate, the force TFT and the pressure component are provided as a sensing substrate, and the display substrate is attached to the sensing substrate.

17. The display panel of claim 15, wherein the light emitting layer and the pressure sensing layer are disposed at different sides of the display panel to allow the pressure sensing layer not to be patterned.

18. A display device, comprising the display panel of claim 12.

* * * * *

UNITED STATES PATENT AND TRADEMARK OFFICE
CERTIFICATE OF CORRECTION

PATENT NO. : 11,393,871 B2  
APPLICATION NO. : 16/093355  
DATED : July 19, 2022  
INVENTOR(S) : Yuzhen Guo et al.

It is certified that error appears in the above-identified patent and that said Letters Patent is hereby corrected as shown below:

On the Title Page

Under Item (71) Applicant, please remove "BOE TECHNOLOGY GROUP CO., LTD" and replace with "BOE TECHNOLOGY GROUP CO., LTD.".

Signed and Sealed this  
Twenty-seventh Day of June, 2023

Katherine Kelly Vidal  
*Director of the United States Patent and Trademark Office*